US012033901B2

(12) United States Patent
Li et al.

(10) Patent No.: US 12,033,901 B2
(45) Date of Patent: Jul. 9, 2024

(54) DEVICE AND METHOD USED FOR MEASURING WAFERS

(71) Applicant: Raintree Scientific Instruments (Shanghai) Corporation, Shanghai (CN)

(72) Inventors: Bin Li, Shanghai (CN); Haijun Gao, Shanghai (CN)

(73) Assignee: Raintree Scientific instruments (Shanghai) Corporation, Shanghai (CN)

( * ) Notice: Subject to any disclaimer, the term of this patent is extended or adjusted under 35 U.S.C. 154(b) by 559 days.

(21) Appl. No.: 17/290,706

(22) PCT Filed: Nov. 1, 2019

(86) PCT No.: PCT/CN2019/115124
§ 371 (c)(1),
(2) Date: Jun. 16, 2021

(87) PCT Pub. No.: WO2020/088669
PCT Pub. Date: May 7, 2020

(65) Prior Publication Data
US 2022/0020648 A1 Jan. 20, 2022

(30) Foreign Application Priority Data
Nov. 2, 2018 (CN) .......................... 201811300273.2

(51) Int. Cl.
H01L 21/12 (2006.01)
H01L 21/66 (2006.01)
(Continued)

(52) U.S. Cl.
CPC ........ *H01L 22/12* (2013.01); *H01L 21/67253* (2013.01); *H01L 21/681* (2013.01)

(58) Field of Classification Search
CPC ......... G01R 33/00; G01C 17/38; G06F 3/012; H01L 22/12; H01L 21/67253; H01L 21/681
See application file for complete search history.

(56) References Cited

U.S. PATENT DOCUMENTS

2007/0288219 A1* 12/2007 Zafar .................... G06T 7/0008
703/14
2008/0013089 A1* 1/2008 Ishii ...................... G03F 9/7011
356/400

(Continued)

FOREIGN PATENT DOCUMENTS

CN 108288296 A 7/2018
CN 108288593 7/2018

(Continued)

Primary Examiner — Jermele M Hollington
Assistant Examiner — Taqi R Nasir

(57) ABSTRACT

The present disclosure relates to a device and method for measuring wafers. The device comprises: a moving platform, which is used to adjust the location of wafers; a first pre-alignment module and a first image recognition module, which are used to align a first wafer at a first location on the moving platform before measuring the first wafer; a second pre-alignment module and a second image recognition module, which are used to align a second wafer at a second location on the moving platform before measuring the second wafer; and a measurement module, which is used to measure the first wafer and the second wafer at a third location on the moving platform, wherein the first location, second location and third location are different from each other. The embodiments of the present disclosure may improve the measurement efficiency of the device.

22 Claims, 4 Drawing Sheets

(51) Int. Cl.
    *H01L 21/67*        (2006.01)
    *H01L 21/68*        (2006.01)

(56)            References Cited

U.S. PATENT DOCUMENTS

2008/0151234 A1*   6/2008   Imai ................. G01N 21/95607
                                                           702/95
2019/0139798 A1*   5/2019   Fonseca ................. H01L 22/20

FOREIGN PATENT DOCUMENTS

CN       209183508 U     7/2019
KR       100744000       7/2007
KR       100805233       2/2008

* cited by examiner

DEVICE AND METHOD USED FOR MEASURING WAFERS

TECHNICAL FIELD

The present disclosure relates to the field of semiconductor wafer measurement, in particular to a device and method for measuring wafers.

BACKGROUND ART

Semiconductor wafers can be manufactured as having patterns used for forming integrated circuits. In the production process of large-scale integrated circuits, for example, the thickness of various film layers is one of the important process parameters. As the degree of integration of semiconductor circuits becomes higher and higher, the requirement for the accuracy of film layer thickness also becomes higher and higher. Any slight change in the thickness will directly impact the performance of future integrated circuits. While the accuracy increases, the increase of measurement efficiency also becomes one of the key factors in evaluating the performance of the measurement device.

SUMMARY OF THE INVENTION

The highest measurement efficiency of the devices currently known in the market is 200 pieces/hour, which needs further improvement.

To at least partially solve the above-mentioned and other potential problems, the embodiments of the present disclosure provide a device and method for measuring wafers.

According to a first aspect of the present disclosure, a device for measuring wafers is provided. The device comprises: a moving platform, which is used to adjust the location of wafers; a first pre-alignment module and a first image recognition module, which are used to align a first wafer at a first location on the moving platform before measuring the first wafer; a second pre-alignment module and a second image recognition module, which are used to align a second wafer at a second location on the moving platform before measuring the second wafer; and a measurement module, which is used to measure the first wafer and the second wafer at a third location on the moving platform, wherein the first location, second location and third location are different from each other.

In an embodiment, the moving platform comprises: a first workpiece table, which is used to transfer the first wafer between the first location and the third location; and a second workpiece table, which is used to transfer the second wafer between the second location and the third location.

In an embodiment, the device further comprises: a third image recognition module, which is used to align the first wafer and the second wafer at the third location during the measurement of the first wafer and the second wafer.

In an embodiment, the device further comprises: a mechanical hand, which is used to place the first wafer and the second wafer taken out of a wafer box at the first location and the second location respectively, and to put the first wafer and the second wafer having undergone measurement from the first location and the second location respectively back into the wafer box.

In an embodiment, the mechanical hand is able to move between the first location and the second location.

In an embodiment, the moving platform is a four-dimensional moving platform.

In an embodiment, the first pre-alignment module and the second pre-alignment module each comprises: a laser generator and a laser sensor, the laser generators and the laser sensors utilizing the notches on the first wafer and the second wafer to achieve alignment of the first wafer and the second wafer.

In an embodiment, the first image recognition module and the second image recognition module achieve alignment of the first wafer and the second wafer through recognition of the patterns on the first wafer and the second wafer.

In an embodiment, the device further comprises: an environmental control module, which is used to control the temperature, humidity and vibration of the measurement environment.

In an embodiment, the measurement module comprises an optical system.

In an embodiment, the device is used for measuring the film thickness and line width of the first wafer and the second wafer.

According to a second aspect of the present disclosure, a method for measuring wafers is provided. The method comprises: before measuring a first wafer, aligning the first wafer at a first location on a moving platform using a first pre-alignment module and a first image recognition module; before measuring a second wafer, aligning the second wafer at a second location on the moving platform using a second pre-alignment module and a second image recognition module; while aligning the second wafer at the second location on the moving platform, measuring the first wafer at a third location on the moving platform using a measurement module; and after measuring the first wafer, measuring the second wafer at the third location using the measurement module; wherein the first location, second location and third location are different from each other.

In an embodiment, the method further comprises while measuring the second wafer at the third location: swapping a third wafer for the first wafer at the first location; and aligning the third wafer at the first location using the first pre-alignment module and the first image recognition module.

In an embodiment, the moving platform comprises a first workpiece table and a second workpiece table, and the method further comprises: after aligning the first wafer, transferring the first wafer from the first location to the third location using the first workpiece table; after measuring the first wafer at the third location, transferring the first wafer from the third location to the first location using the first workpiece table; after aligning the second wafer, transferring the second wafer from the second location to the third location using the second workpiece table; and after measuring the second wafer at the third location, transferring the second wafer from the third location to the second location using the second workpiece table.

In an embodiment, the method further comprises: during the measurement of the first wafer and the second wafer, aligning the first wafer and the second wafer at the third location using a third image recognition module.

In an embodiment, the method further comprises: placing the first wafer and the second wafer taken out of a wafer box at the first location and the second location respectively; and putting the first wafer and the second wafer having undergone measurement from the first location and the second location respectively back into the wafer box.

In an embodiment, the moving platform is a four-dimensional moving platform.

In an embodiment, the first pre-alignment module and the second pre-alignment module each comprises: a laser generator and a laser sensor, the laser generators and the laser sensors utilizing the notches on the first wafer and the second wafer to achieve alignment of the first wafer and the second wafer.

In an embodiment, the first image recognition module and the second image recognition module achieve alignment of the first wafer and the second wafer through recognition of the patterns on the first wafer and the second wafer.

In an embodiment, the method further comprises: controlling the temperature, humidity and vibration of the measurement environment.

In an embodiment, the measurement module comprises an optical system.

In an embodiment, the method is used for measuring the film thickness and line width of the first wafer and the second wafer.

It will be understood through the description below that the embodiments of the present disclosure have the following advantage: through having two pre-alignment modules and two image recognition modules used for preparation work before measurement, preparation work, such as alignment, aimed at the second wafer can be carried out while the first wafer is being measured. This kind of parallel processing saves measuring time, and therefore improves the measurement efficiency.

This Summary is provided to introduce in a simplified form a selection of concepts that are further described below in the Detailed Description. This Summary is not intended to identify key features or essential features of the present disclosure, nor is it intended to limit the scope of the present disclosure.

DESCRIPTION OF THE DRAWINGS

Through more detailed description of the exemplary embodiments of the present disclosure in connection with the drawings, the above-mentioned and other objectives, features and advantages of the present disclosure will become more obvious clear. In the exemplary embodiments of the present disclosure, the same reference numbers generally represent the same parts.

DETAILED DESCRIPTION OF THE EMBODIMENTS

Figure 1:
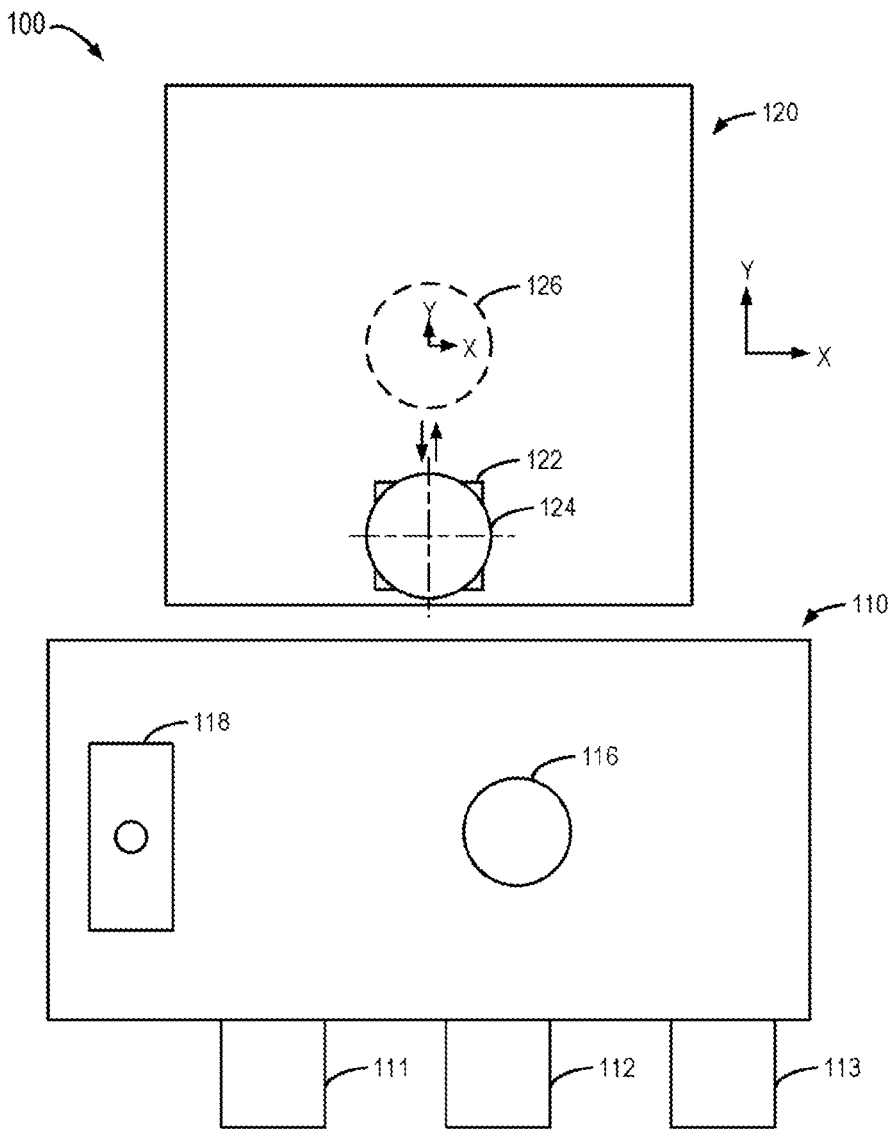
FIG. 1 shows a block diagram of a device for measuring wafers.

Preferred embodiments of the present disclosure will be described in more detail below with reference to the drawings. While preferred embodiments of the present disclosure are shown in the drawings, it should be understood that the present disclosure can be implemented in various forms without being limited to the embodiments set forth here. Instead, these embodiments are provided to make the present disclosure more thorough and complete, and to be able to fully convey the scope of the present disclosure to those skilled in the art.

The term "comprise" and its variations used herein represent inclusiveness in an open sense, i.e. "comprise but not limited to". Unless stated specifically, the term "or" represents "and/or". The term "based on" represents "at least partially based on". The terms "an exemplary embodiment" and "an embodiment" represent "at least one exemplary embodiment". The term "another embodiment" represents "at least one other embodiment". The terms "first", "second", etc. may refer to different or the same objects. Other explicit and implicit meanings might be included hereinafter.

FIG. 1 shows a block diagram of a device 100 for measuring wafers. As shown in FIG. 1, the device 100 comprises a device front-end module 110 and a moving platform 120. The device front-end module 110 comprises a pre-alignment module (not shown), which is located at a pre-alignment location 118 on the device front-end module 110. The pre-alignment module may comprise a laser generator and a laser sensor, in order to utilize the notch on the wafer to achieve pre-alignment/pre-positioning of the wafer. The device front-end module 110 further comprises a mechanical hand 116. The mechanical hand 116 may have one or more arms (not shown), in order to take the wafers out of a wafer box and place them at the pre-alignment location 118. The wafer box may be located at a port of the device front-end module 110. By way of example only, three ports are shown in FIG. 1: a port A 111, a port B 112, and a port C 113.

The moving platform 120 is used for carrying wafers, and moving wafers on a planned route. After a wafer is pre-aligned at the pre-alignment location 118, the mechanical hand 116's arm transfers the wafer from the pre-alignment module to the moving platform 120. Specifically, the wafer is first placed on a workpiece table 122 at a transitional location 124 on the moving platform 120. Then the workpiece table 122 carrying the wafer moves from the transitional location 124 to a measurement location 126. At the measurement location 126 on the moving platform 120, the wafer-to-be-measured will be measured by a measurement module (not shown). Before measurement is carried out, generally at the measurement location 126, an image recognition module (not shown) of the device 100 can further align the wafer through recognition of the patterns on the wafer, in order to, for example, make light focus well on the wafer. On the other hand, the alignment function of the image recognition module is more accurate than the alignment function of the pre-alignment module.

The measurement module may comprise an optical system. In an embodiment, the measurement module can be used for measuring film thickness or line width or the like. In addition, the device 100 shown in FIG. 1 may further comprise an environmental control module, which is used to keep the device 100 always under constant temperature and constant humidity and isolated from external vibration.

Figure 2:
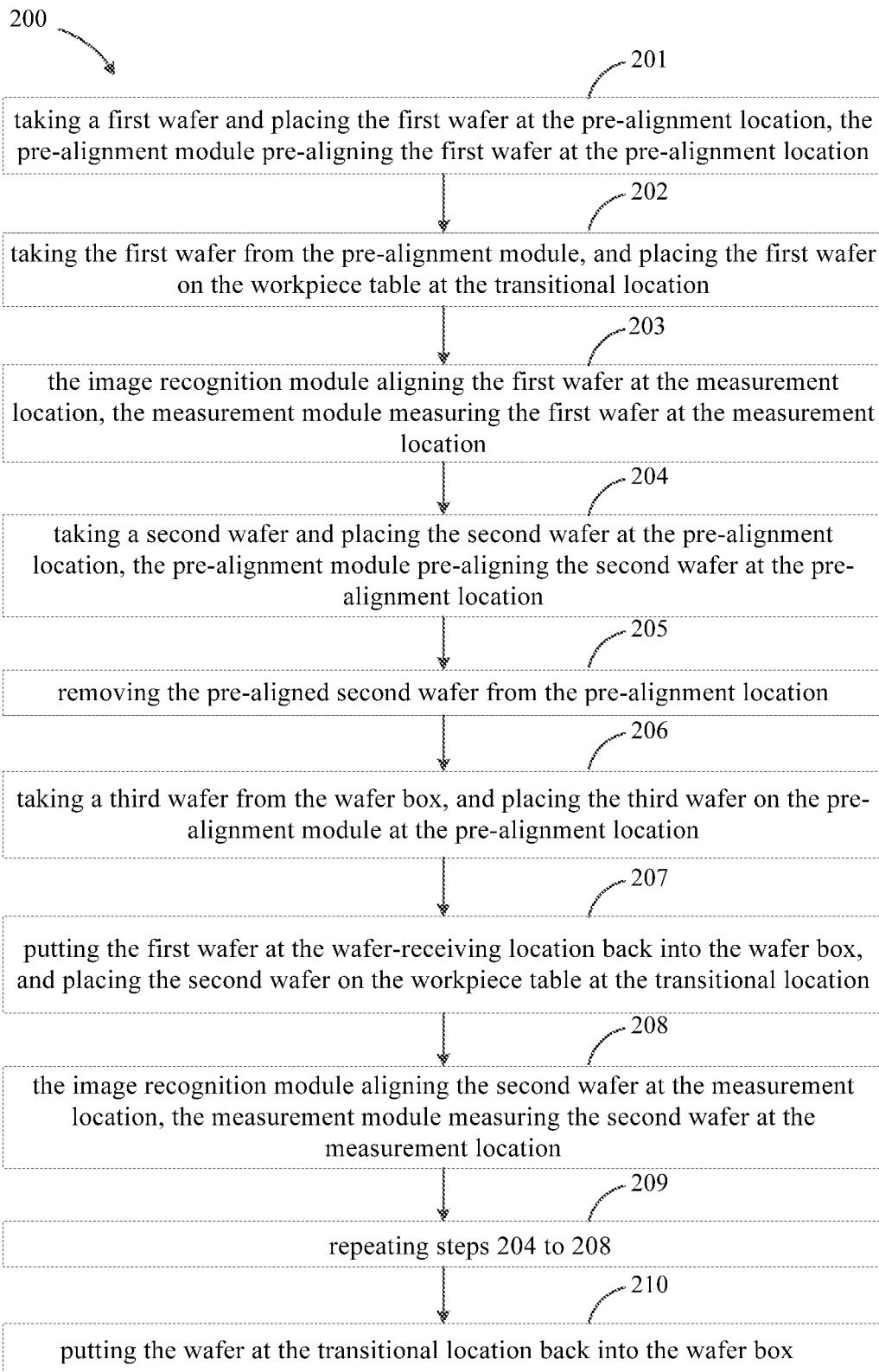
FIG. 2 shows a flowchart of a measurement method using the device shown in FIG. 1.

FIG. 2 shows a flowchart of a measurement method 200 using the device 100 shown in FIG. 1. At 201, for example, the wafer box at the port A 111 of the device front-end module 110 opens. For example, a first arm of the mechanical hand 116 takes a first wafer out of the wafer box, and places the first wafer at the pre-alignment location 118. The pre-alignment module pre-aligns the first wafer at the pre-alignment location 118.

At 202, for example, the first arm of the mechanical hand 116 takes the pre-aligned first wafer from the pre-alignment module, and places the first wafer on the workpiece table 122. At this point, the workpiece table 122 is located at the transitional location 124 on the moving platform 120. Then the workpiece table 122 carrying the wafer-to-be-measured moves from the transitional location 124 to the measurement location 126.

At 203, the image recognition module aligns the first wafer at the measurement location 126, in order for the measurement module (e.g., the optical system) to focus on the wafer. The measurement module measures the first wafer at the measurement location 126 (e.g., measures the film thickness of the wafer). Then, after the measurement is completed, the workpiece table 122 carrying the wafer can move back to the transitional location 124 from the measurement location 126.

At 204, for example, a second arm of the mechanical hand 116 takes a second wafer out of the wafer box, and places the second wafer at the pre-alignment location 118. The pre-alignment module pre-aligns the second wafer at the pre-alignment location 118.

At 205, the first arm removes the pre-aligned second wafer from the pre-alignment location 118.

At 206, for example, the second arm of the mechanical hand 116 takes a third wafer out of the wafer box, and places the third wafer on the pre-alignment module at the pre-alignment location 118, to pre-align the third wafer.

At 207, the second arm removes the measured first wafer from the measurement end (at the transitional location 124 on the moving platform 120) and puts the first wafer back into the wafer box, and the first arm places the pre-aligned second wafer on the workpiece table 122 at the transitional location 124. Then the workpiece table 122 carrying the second wafer moves from the transitional location 124 to the measurement location 126.

At 208, the image recognition module aligns the second wafer at the measurement location 126, and the measurement module measures the second wafer at the measurement location 126. Then, after the measurement is completed, the workpiece table 122 carrying the second wafer can move from the measurement location 126 back to the transitional location 124.

At 209, the steps 204 to 208 are repeated, until all the wafers to be measured are measured.

At 210, the second arm removes the measured wafer from the measurement end (at the transitional location 124 on the moving platform 120), and puts the wafer back into the wafer box.

As can be seen from the above-described steps of the measurement method 200, each time a wafer enters the measurement location 126 on the moving platform 120, image recognition is required to align the wafer more accurately. This image recognition operation takes time at the measurement location 126. If a wafer has already aligned via image recognition before entering the measurement location 126, a lot of time can be saved. In the above-described steps 205 to 207, there are two wafer swaps (at the pre-alignment location 118 and at the transitional location 124 respectively). If these two wafer swaps can be combined into one wafer swap, measuring time can be further reduced. In addition, since the above-described moving platform 120 has only one single workpiece table 122, the measurement location 126 is in an idle state when the workpiece table 122 moves to the transitional location 124 to swap wafers, which is a waste of measuring time.

The present disclosure employs a multi-workpiece-table technique, an integrated pre-aligner and a pre-image-recognition positioning system to further reduce (in parallel processing) the time it takes from a wafer being taken out of the wafer box till the beginning of measurement, and therefore improve the measurement efficiency of the device.

Figure 3:
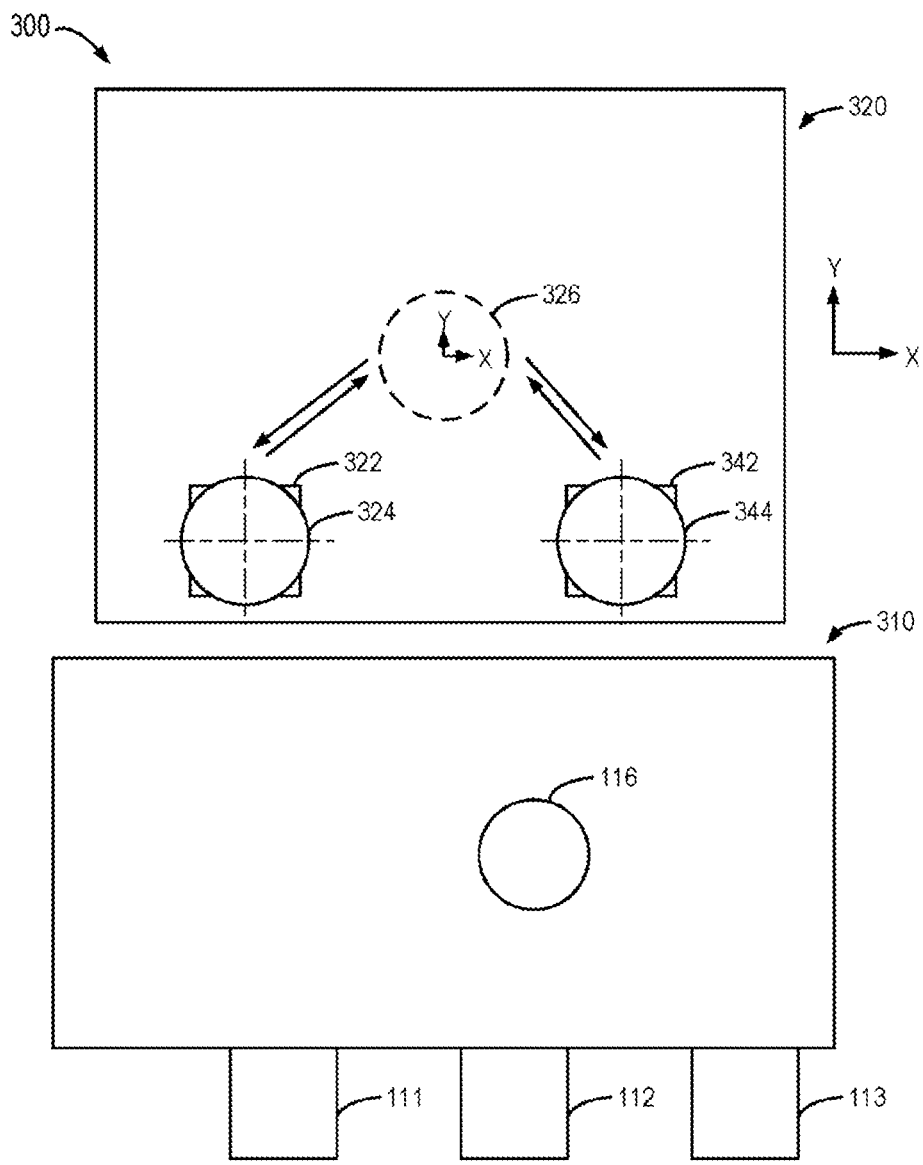
FIG. 3 shows a block diagram of an improved device for measuring wafers.

FIG. 3 shows a block diagram of an improved device 300 for measuring wafers. Similar to the device 100 shown in FIG. 1, the device 300 shown in FIG. 3 comprises a device front-end module 310 and a moving platform 320. Similar to the device front-end module 110 shown in FIG. 1, the device front-end module 310 shown in FIG. 3 may comprise a mechanical hand 116. The mechanical hand 116 may have one or more arms (not shown), in order to take the wafers out of a wafer box and place them at a transitional location (as will be described below). The wafer box may be located at a port of the device front-end module 310. By way of example only, three ports are shown in FIG. 3: a port A 111, a port B 112, and a port C 113. The difference between the device front-end module 310 shown in FIG. 3 and the device front-end module 110 shown in FIG. 1 is that the device front-end module 310 does not comprise a pre-alignment module or a pre-alignment location. Accordingly, the mechanical hand 116's arm can take a wafer from the wafer box directly to the moving platform 320.

Similar to the moving platform 120 in FIG. 1, the moving platform 320 shown in FIG. 3 is used for carrying wafers and adjusting the location of wafers. Different from the moving platform 120 in FIG. 1 which has only one workpiece table 122, the moving platform 320 shown in FIG. 3 may have at least two workpiece tables: a first workpiece table 322 and a second workpiece table 342. The first workpiece table 322 and the second workpiece table 342 are located respectively at a first transitional location 324 (also referred to as the first location) and a second transitional location 344 (also referred to as the second location) on the moving platform 320. The mechanical hand 116's arm can place the wafer taken out of the wafer box on the first workpiece table 322 at the first transitional location 324 or on the second workpiece table 342 at the second transitional location 344. Then the wafer-carrying first workpiece table 322 and second workpiece table 342 can move respectively from the first transitional location 324 and the second transitional location 344 to a measurement location 326 (also referred to as the third location). A measurement module (not shown) measures the wafers at the measurement location 326 on the moving platform 320. After the measurement is completed, the first workpiece table 322 and the second workpiece table 342 can transfer the wafers from the measurement location 326 back to the first transitional location 324 and the second transitional location 344 respectively.

In FIG. 3, instead of being located on the device front-end module 110 as shown in FIG. 1, the pre-alignment modules are located at the moving platform 320. Specifically, a first pre-alignment module (not shown) may be located at the first transitional location 324, and a second pre-alignment module (not shown) may be located at the second transitional location 344, in order to accomplish preliminary alignment of the wafers in coordination with the rotation axis of the moving platform 320. As stated above, the first pre-alignment module and the second pre-alignment module can achieve pre-alignment/pre-positioning of the wafers. In addition, different from the image recognition module in FIG. 1 functioning at the measurement location 126, in FIG. 3, there are correspondingly a first image recognition module (not shown) and a second image recognition module (not shown) located respectively at the first transitional location 324 and the second transitional location 344. Therefore, after pre-alignment of the wafers is accomplished and before the wafers enter the measurement location 326, image recognition and positioning can be employed to fulfill the final positioning requirement of the wafers, and thereby reducing the time spent at the measurement location 326. In other words, before entering the measurement location 326 to be measured, at the first transitional location 324, the wafer is first pre-aligned by the first pre-alignment module, and then further aligned using the first image recognition module, in order to achieve alignment of the wafer. This applies to the case of the second transitional location 344 as well. Since the first pre-alignment module and the first image recognition module are both located at the first transitional location 324, they can be separate modules or can be integrated together. This applies to the case of the second pre-alignment module and the second image recognition module as well.

It can thus be seen that the present disclosure has the following advantages. Through utilizing the special device front-end module 310 and moving platform 320, some of the measurement steps can be processed in parallel, and measuring time can be reduced. Specifically, the device 300 shown in FIG. 3 employs a double-workpiece-table (or multi-workpiece-table) operation mode, wherein each workpiece table at the wafer-swapping location (i.e., at the above-described transitional location) has an independent pre-alignment module and image recognition module, in order for the preceding operations before measurement to be carried out separately and independently. Two (or more) workpiece tables operate without interference from each other. In this way, measurement can be carried out on one workpiece table while preparation is being done on another workpiece table, and with two workpiece tables in parallel processing, working time is saved and efficiency is improved. In addition, through optimizing the moving trajectory and the measurement algorithm while increasing the efficiency of pre-alignment and image recognition, the time spent in the measurement process and in the preparation process before measurement can be made equal, therefore absolute parallelism can be achieved and thereby saving time.

In an embodiment, there is provided a third image recognition module at the measurement location 326. The third image recognition module is used mainly to align the wafer at the measurement location 326 during measurement of the wafer.

In an embodiment, the first pre-alignment module and the second pre-alignment module may each comprise a laser generator and a laser sensor. The laser generators and the laser sensors can utilize the notches on the wafers to achieve alignment of the wafers. In an embodiment, the first image recognition module and the second image recognition module can achieve alignment of the wafers through recognition of the patterns on the wafers. It can be understood that the alignment accuracy of the first and second image recognition modules is higher than the alignment accuracy of the first and second pre-alignment modules.

In an embodiment, since two workpiece tables are provided, the mechanical hand 116 can move between the first transitional location 324 and the second transitional location 344 (specifically, in the X direction), and thereby fulfilling the movement requirement of loading wafers onto the two workpiece tables respectively. In this way, the same mechanical hand 116 can be used to place the wafers taken out of the wafer box respectively at the first transitional location 324 and the second transitional location 344, and to remove the measured wafers respectively from the first transitional location 324 and the second transitional location 344 and put them back into the wafer box, therefore the construction of the device 300 is simplified.

In an embodiment, the moving platform 320 is a four-dimensional moving platform. That is, the moving platform 320 can move with high speed on the X, Y, Z and theta (also referred to as the T axis) axes, wherein the X, Y and Z axes represent an orthogonal coordinate system, and the theta axis represents the circumferential direction. Movement on the X and Y axes can move the workpiece tables in the plane of the moving platform 320. With the help of the first image recognition module and the second image recognition module, the first workpiece table 322 and the second workpiece table 342 can adjust the location of wafers on the Z axis, in order to obtain accurate focusing of light on the wafers. The first workpiece table 322 and the second workpiece table 342 can also rotate freely along the theta axis, so as to help accomplish pre-alignment of the wafers through the pre-alignment modules.

In an embodiment, the measurement module may comprise an optical system, in order to achieve measurement of the wafers through optical measurement. In an embodiment, the measurement module can be used for measuring film thickness or line width or the like. In addition, the device 300 shown in FIG. 3 may further comprise an environmental control module, which is used to control the temperature, humidity and vibration, etc. of the measurement environment, in order to provide stable measurement conditions.

Figure 4:
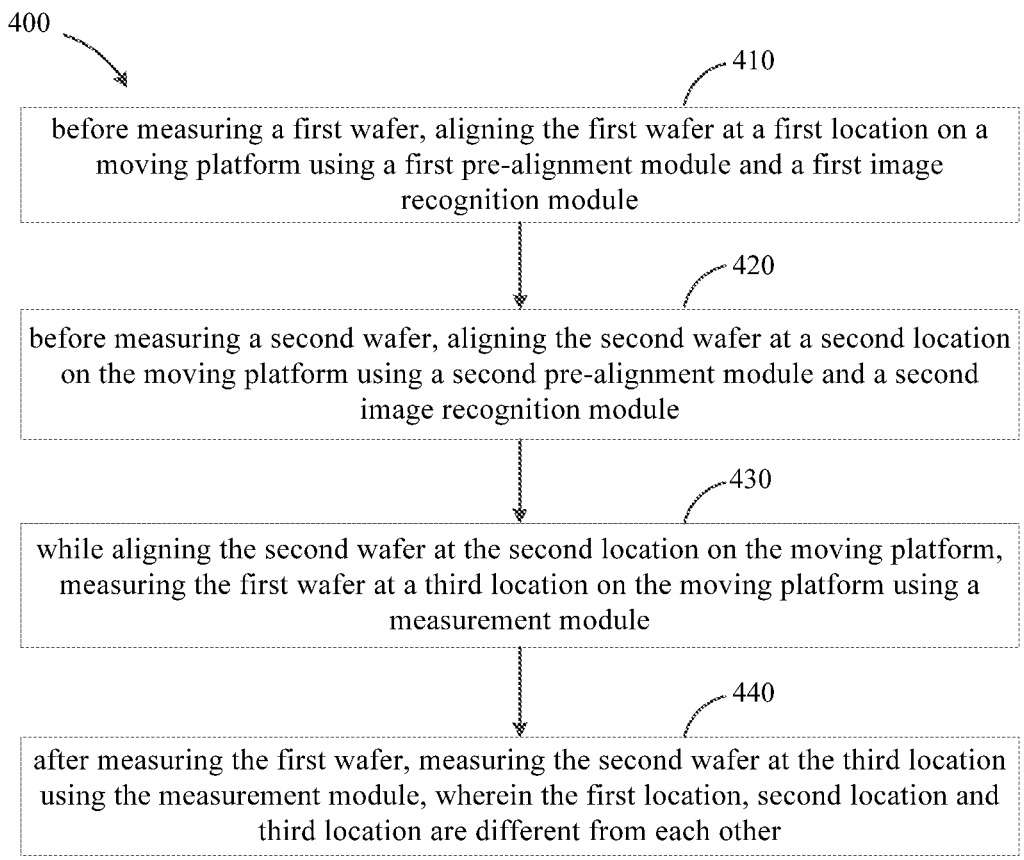
FIG. 4 shows a flowchart of a measurement method using the device shown in FIG. 3.

FIG. 4 shows a flowchart of a measurement method 400 using the device shown in FIG. 3. At 410, before a first wafer is measured, the first wafer is aligned at a first location on the moving platform using the first pre-alignment module and the first image recognition module. At 420, before a second wafer is measured, the second wafer is aligned at a second location on the moving platform using the second pre-alignment module and the second image recognition module. At 430, while the second wafer is being aligned at the second location on the moving platform, the first wafer is measured at a third location on the moving platform using the measurement module. At 440, after the first wafer is measured, the second wafer is measured at the third location using the measurement module, wherein the first location, second location and third location are different from each other.

In an embodiment, the method 400 may further comprise while measuring the second wafer at the third location: swapping a third wafer for the first wafer at the first location; and aligning the third wafer at the first location using the first pre-alignment module and the first image recognition module.

In an embodiment, the moving platform comprises a first workpiece table and a second workpiece table, and the method 400 may further comprise: after aligning the first wafer, transferring the first wafer from the first location to the third location using the first workpiece table; after measuring the first wafer at the third location, transferring the first wafer from the third location to the first location using the first workpiece table; after aligning the second wafer, transferring the second wafer from the second location to the third location using the second workpiece table; and after measuring the second wafer at the third location, transferring the second wafer from the third location to the second location using the second workpiece table.

More specifically, the method 400 shown in FIG. 4 can be described as follow. The mechanical hand 116's arm can take a first wafer out of the wafer box and place the first wafer on the first workpiece table 322 at the first transitional location 324. The first wafer undergoes pre-alignment and image recognition at the first transitional location 324 and undergoes measurement at the measurement location 326, in the meantime, the mechanical hand 116's arm can take a second wafer out of the wafer box and place the second wafer on the second workpiece table 342 at the second transitional location 344, and the second wafer undergoes pre-alignment and image recognition at the second transitional location 344. Then the first wafer having undergone measurement is transferred by the first workpiece table 322 back to the first transitional location 324 to be swapped with a third wafer, and the third wafer undergoes pre-alignment and image recognition at the first transitional location 324, in the meantime, the second wafer is transferred by the second workpiece table 342 to the measurement location 326 to be measured. Then the second wafer having undergone measurement is transferred back to the second transitional location 344 to be swapped with a fourth wafer, and the fourth wafer undergoes pre-alignment and image recognition at the second transitional location 344, in the meantime, the third wafer is transferred by the first workpiece table 322 to the measurement location 326 to be measured. And so on, until the measurement is completed.

As can be seen from the method 400 shown in FIG. 4, since the pre-alignment function is arranged at the first location 324 and the second location 344 on the moving platform 320, the time spent on one wafer swap can be saved. In the meantime, since the image recognition function is transferred from the third location (measurement location) 326 to the first location 324 and the second location 344, the time spent on image recognition and correction each time at the measurement location 326 can be saved (the time spent on image recognition and correction can go in parallel with measuring time), and all the working time of the device is spent on measurement. Other time is substantially reduced or processed in parallel, therefore the measurement efficiency is significantly improved. According to calculation, by employing the device and method of the present disclosure, the measurement efficiency is expected to increase from current 200 pieces/hour to 300 pieces/hour.

In an embodiment, the method 400 may further comprise: during the measurement of the first wafer and the second wafer, aligning the first wafer and the second wafer at the third location using a third image recognition module.

In an embodiment, the method 400 may further comprise: placing the first wafer and the second wafer taken out of a wafer box at the first location and the second location respectively; and putting the first wafer and the second wafer having undergone measurement from the first location and the second location respectively back into the wafer box.

In an embodiment, the moving platform is a four-dimensional moving platform.

In an embodiment, the first pre-alignment module and the second pre-alignment module each comprises a laser generator and a laser sensor. The laser generators and the laser sensors utilize the notches on the first wafer and the second wafer to achieve alignment of the first wafer and the second wafer.

In an embodiment, the first image recognition module and the second image recognition module achieve alignment of the first wafer and the second wafer through recognition of the patterns on the first wafer and the second wafer.

In an embodiment, the method 400 can further control the temperature, humidity and vibration of the measurement environment.

In an embodiment, the measurement module comprises an optical system.

In an embodiment, the method 400 can be used for measuring the film thickness and line width of wafers.

The flowcharts and block diagrams in the drawings illustrate the architecture, functionality, and operation of possible implementations of systems, methods, and computer program products according to various embodiments of the present disclosure. In this regard, each block in the flowchart or block diagram may represent a module, program segment, or portion of instruction, which module, program segment, or portion of instruction comprises one or more executable instructions for implementing the specified logical function(s). In some alternative implementations, the functions noted in the block may occur out of the order noted in the figure. For example, two blocks shown in succession may, in fact, be executed substantially concurrently, or may sometimes be executed in the reverse order, depending upon the functionality involved. It will also be noted that each block in the block diagram and/or flowchart, and combinations of blocks in the block diagram and/or flowchart, can be implemented by special purpose hardware-based systems that perform the specified functions or acts, or by combinations of special purpose hardware and computer instructions.

The embodiments of the present disclosure have been described hereinabove. The illustration above is exemplary and not exhaustive, nor is it limited to the disclosed embodiments. Without departing from the scope and spirit of the illustrated embodiments, many modifications and alterations will be apparent to those ordinarily skilled in the art. The choice of terminology use herein is intended to best explain the principles, practical applications, or technical improvements over techniques in the market of the embodiments, or to enable others ordinarily skilled in the art to understand the embodiments disclosed herein.

The present disclosure relates to a device and method used for measuring wafers. The device comprises: a moving platform, which is used to adjust the location of wafers; a first pre-alignment module and a first image recognition module, which are used to align a first wafer at a first location on the moving platform before measuring the first wafer; a second pre-alignment module and a second image recognition module, which are used to align a second wafer at a second location on the moving platform before measuring the second wafer; and a measurement module, which is used to measure the first wafer and the second wafer at a third location on the moving platform, wherein the first location, second location and third location are different from each other. The embodiments of the present disclosure may improve the measurement efficiency of the device.

What is claimed is:

1. A device for measuring wafers, comprising:
a moving platform, for adjusting the location of wafers;
a first pre-alignment module and a first image recognition module, for aligning a first wafer at a first location on the moving platform before measuring the first wafer;
a second pre-alignment module and a second image recognition module, for aligning a second wafer at a second location on the moving platform before measuring the second wafer; and
a measurement module, for measuring the first wafer at a third location on the moving platform while the second wafer is being aligned at the second location on the moving platform and measuring the second wafer at the third location on the moving platform after measuring the first wafer;
wherein the first location, the second location and the third location are different from each other.

2. The device according to claim 1, wherein the moving platform comprises:
a first workpiece table, for transferring the first wafer between the first location and the third location; and
a second workpiece table, for transferring the second wafer between the second location and the third location.

3. The device according to claim 1, further comprising:
a third image recognition module, for aligning the first wafer and the second wafer at the third location during the measurement of the first wafer and the second wafer.

4. The device according to claim 1, further comprising:
a mechanical hand, for placing the first wafer and the second wafer taken out of a wafer box at the first location and the second location respectively, and putting the measured first wafer and the measured second wafer from the first location and the second location respectively back into the wafer box.

5. The device according to claim 4, wherein the mechanical hand is configured to move between the first location and the second location.

6. The device according to claim 1, wherein the moving platform is a four-dimensional moving platform.

7. The device according to claim 1, wherein the first pre-alignment module comprises a first laser generator and a first laser sensor, and the second pre-alignment module comprises a second laser generator and a second laser sensor; and
the first laser generator and the first laser sensor utilize one or more notches on the first wafer to align the first wafer, and the second laser generator and the second laser sensor utilize one or more notches on the second wafer to align the second wafer.

8. The device according to claim 1, wherein the first image recognition module and the second image recognition module are configured to align the first wafer and the second wafer through recognition of the patterns on the first wafer and the second wafer.

9. The device according to claim 1, further comprising:
an environmental control module, for controlling temperature, humidity and vibration of a measurement environment.

10. The device according to claim 1, wherein the measurement module comprises an optical system.

11. The device according to claim 1, wherein the device is used for measuring film thickness and line width of the first wafer and the second wafer.

12. A method for measuring wafers, comprising:
before measuring a first wafer, aligning the first wafer at a first location on a moving platform using a first pre-alignment module and a first image recognition module;
before measuring a second wafer, aligning the second wafer at a second location on the moving platform using a second pre-alignment module and a second image recognition module;
while aligning the second wafer at the second location on the moving platform, measuring the first wafer at a third location on the moving platform using a measurement module; and
after measuring the first wafer, measuring the second wafer at the third location using the measurement module,
wherein the first location, the second location and the third location are different from each other.

13. The method according to claim 12, further comprising while measuring the second wafer at the third location:
swapping a third wafer for the first wafer at the first location; and
aligning the third wafer at the first location using the first pre-alignment module and the first image recognition module.

14. The method according to claim 12, wherein the moving platform comprises a first workpiece table and a second workpiece table, the method further comprising:
after aligning the first wafer, transferring the first wafer from the first location to the third location using the first workpiece table;
after measuring the first wafer at the third location, transferring the first wafer from the third location to the first location using the first workpiece table;
after aligning the second wafer, transferring the second wafer from the second location to the third location using the second workpiece table; and
after measuring the second wafer at the third location, transferring the second wafer from the third location to the second location using the second workpiece table.

15. The method according to claim 12, further comprising:
during the measurement of the first wafer and the second wafer, aligning the first wafer and the second wafer at the third location using a third image recognition module.

16. The method according to claim 12, further comprising:
placing the first wafer and the second wafer taken out of a wafer box at the first location and the second location respectively; and
putting the measured first wafer and the measured second wafer from the first location and the second location respectively back into the wafer box.

17. The method according to claim 12, wherein the moving platform is a four-dimensional moving platform.

18. The method according to claim 12, wherein the first pre-alignment module comprises a first laser generator and a first laser sensor, and the second pre-alignment module comprises a second laser generator and a second laser sensor; and
the first laser generator and the first laser sensor utilize one or more notches on the first wafer to align the first wafer, and the second laser generator and the second laser sensor utilize one or more notches on the second wafer to align the second wafer.

19. The method according to claim 12, wherein the first image recognition module and the second image recognition module are configured to align the first wafer and the second wafer through recognition of the patterns on the first wafer and the second wafer.

20. The method according to claim 12, further comprising:
controlling temperature, humidity and vibration of a measurement environment.

21. The method according to claim 12, wherein the measurement module comprises an optical system.

22. The method according to claim 12, wherein the method is used for measuring film thickness and line width of the first wafer and the second wafer.

* * * * *